(12) United States Patent
Nakai et al.

(10) Patent No.: US 7,742,358 B2
(45) Date of Patent: Jun. 22, 2010

(54) POWER SUPPLY CIRCUIT AND SEMICONDUCTOR MEMORY

(75) Inventors: Jun Nakai, Yokohama (JP); Yoshikazu Takeyama, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/435,069

(22) Filed: May 4, 2009

(65) Prior Publication Data

US 2009/0212852 A1 Aug. 27, 2009

Related U.S. Application Data

(62) Division of application No. 11/939,984, filed on Nov. 14, 2007, now Pat. No. 7,551,507.

(30) Foreign Application Priority Data

Nov. 16, 2006 (JP) ............................... 2006-310240

(51) Int. Cl.
*G11C 5/14* (2006.01)
(52) U.S. Cl. ............. 365/226; 365/189.09; 365/189.11; 327/540; 326/80
(58) Field of Classification Search .................. 365/226, 365/189.09, 189.11
See application file for complete search history.

(56) References Cited

U.S. PATENT DOCUMENTS

| | | | |
|---|---|---|---|
| 5,553,030 A | 9/1996 | Tedrow et al. | |
| 5,614,855 A * | 3/1997 | Lee et al. | 327/158 |
| 6,560,145 B2 | 5/2003 | Martines et al. | |
| 7,054,089 B2 * | 5/2006 | Kokami | 360/73.03 |
| 7,158,332 B2 * | 1/2007 | Kokami | 360/75 |
| 7,253,676 B2 | 8/2007 | Fukuada et al. | |
| 7,310,115 B2 * | 12/2007 | Tanimoto | 348/372 |
| 7,551,507 B2 * | 6/2009 | Nakai et al. | 365/226 |
| 2005/0110560 A1 | 5/2005 | Kim et al. | |
| 2008/0290852 A1 * | 11/2008 | Ogawa et al. | 323/283 |

FOREIGN PATENT DOCUMENTS

| | | | | |
|---|---|---|---|---|
| JP | 362186236 A | * | 8/1987 | |
| JP | 403148092 A | * | 6/1991 | |
| JP | 2002-100974 A | | 4/2002 | |
| JP | 02002100974 A | * | 4/2002 | |
| JP | 2003-348822 A | | 12/2003 | |
| JP | 02003348822 A | * | 12/2003 | |
| JP | 2005-190533 | | 7/2005 | |
| JP | 2005-267712 A | | 9/2005 | |
| JP | 02005267712 A | * | 9/2005 | |
| JP | 2008-130104 A | | 6/2008 | |
| JP | 02008130104 A | * | 6/2008 | |

* cited by examiner

*Primary Examiner*—Viet Q Nguyen
(74) *Attorney, Agent, or Firm*—Oblon, Spivak, McClelland, Maier & Neustadt, L.L.P.

(57) ABSTRACT

A power supply circuit outputs different set potentials in response to control signals, wherein a voltage detecting circuit changes levels of a first reference potential and a second reference potential in response to inputs of control signals, and a clock generating circuit increases a frequency of the frequency divided clock signal when the levels of the first reference potential and the second reference potential are greatly changed in response to the inputs of the control signals.

2 Claims, 6 Drawing Sheets

POWER SUPPLY CIRCUIT AND SEMICONDUCTOR MEMORY

CROSS-REFERENCE TO RELATED APPLICATION

This application is a divisional of U.S. application Ser. No. 11/939,984, filed Nov. 14, 2007 now U.S. Pat. No. 7,551,507 and is based upon and claims the benefit of priority from the prior Japanese Patent Application No. 2006-310240, filed on Nov. 16, 2006, the entire contents of which are incorporated herein by reference.

BACKGROUND OF THE INVENTION

1. Field of the Invention

The present invention relates to a power supply circuit including a boosting circuit for boosting a power supply voltage and a semiconductor memory including the power supply circuit.

2. Background Art

Conventionally, for example, a semiconductor memory such as a NAND flash memory includes a power supply circuit for boosting a power supply voltage through a boosting circuit and supplying the power supply voltage.

For example, a semiconductor memory such as a NAND flash memory requires a higher potential than a power supply voltage because data is written, deleted, and read in the semiconductor memory. Thus such a semiconductor memory includes a boosting circuit for boosting a power supply voltage and a voltage detecting circuit for keeping the potential at a set potential.

In the boosting circuit, MOS transistors and capacitances are connected in series and one ends of the capacitances are connected via complementary CLK and CLKB signals to boost a power supply voltage.

The voltage detecting circuit includes a voltage dividing circuit and a comparator amplifier circuit. The output terminal of the boosting circuit and a ground potential are connected in series via the voltage dividing circuit. The comparator amplifier circuit compares a monitored potential outputted from the voltage dividing circuit with a reference potential.

As an example of the change of a detection level in the voltage detecting circuit, a plurality of n-type MOS transistors having ground potentials on the sources of the transistors are connected from the junction point of voltage dividing resistors of the voltage dividing circuit. A selecting signal is inputted to each of the gates of the transistors.

The selecting signal determines the set potential of the output of the boosting circuit. When the boosting circuit has an output lower than the set potential, the monitored potential is lower than the reference potential and the comparator amplifier circuit switches the output to, e.g., "High". This output activates the boosting circuit and the output of the boosting circuit is boosted by a CLK/CLKB signals.

Conversely, when the boosting circuit has an output higher than the set potential, the monitored potential is higher than the reference potential and the comparator amplifier circuit switches the output to, e.g., "Low". This output deactivates the boosting circuit and the CLK/CLKB signals are interrupted to stop the boosting operation of the boosting circuit.

As described above, the voltage detecting circuit activates and deactivates the boosting circuit, thereby keeping the output of the boosting circuit at around the set potential.

In the boosting operation, the output potential is not always kept at a fixed potential but fluctuates at around the set potential. This phenomenon is called ripples which increase or decrease with an RC time constant based on the resistance of the voltage dividing resistor, the operation delay of the comparator amplifier circuit, and the boosting capability of the boosting circuit. When the voltage dividing resistor has a large resistance, ripples increase with the operation delay of the comparator amplifier circuit and the boosting capability of the boosting circuit.

When the voltage dividing resistors have equal resistances and the same comparator amplifier circuit is used, the voltage detecting circuit has a constant rate of reaction relative to fluctuations in the potential of the boosting circuit. Therefore, time periods for switching the outputs of the voltage detecting circuit are substantially constant.

The output potential and the current of the boosting circuit have the following relationship: when the output potential of the boosting circuit is high, the output current is low. When the output potential of the boosting circuit is low, the output current is high.

Therefore, examining the output of the boosting circuit when the voltage detecting circuit has a low set potential, a current that can be outputted in a fixed time period increases and thus ripples increase.

On the other hand, when the voltage detecting circuit has a high set potential, a current that can be outputted in the fixed time period decreases and thus ripples decrease.

Furthermore, from another aspect, data is written in the cells of a NAND flash memory by the potential boosted by a boosting circuit.

However, the cell characteristics are not all uniform and the cells have different writing potentials enabling writing.

Thus the NAND flash memory is characterized in that the writing potential is gradually increased from a proper initial value and a writing operation is performed for each increase such that writing can be sequentially completed from a cell having a low potential enabling writing to a cell having a high potential enabling writing.

In order to achieve this operation, the voltage dividing resistors of the voltage detecting circuit for determining the set potential of the boosting circuit are adjusted to obtain a desired potential with a gradual increase from the output of the boosting circuit.

There is a problem that when the set potential is changed, as described above, the ripples of the output of the boosting circuit increase at a low set potential.

During a writing operation on cells of a NAND flash memory, when large ripples occur on the word lines of a selected cell and an unselected cell, for example, a Vth distribution of written cells expands and writing is erroneously performed on the unselected cell. Therefore, small ripples are more desirable. If further multiple values are stored in memory cells in the future, it would be strongly desired to suppress the expansion of a Vth distribution.

However, as described above, during a writing operation on a cell having a low potential enabling writing, when the voltage dividing resistors of the voltage detecting circuit are adjusted to set a low output of the boosting circuit, the conventional circuit has large ripples and deteriorates the characteristics of writing on memory cells.

In this conventional power supply circuit, the voltage detecting circuit has two detection levels and the boosting circuit performs a boosting operation with normal boosting capability until a low first detection level. In some power supply circuits, when exceeding the first detection level, the frequency of an input clock signal is reduced and the boosting capability is degraded to activate or deactivate the boosting circuit at around a higher second detection level (for example, see Japanese Patent Laid-Open No. 2005-190533).

Although ripples can be reduced at around a set potential in this conventional power supply circuit, the dependence of ripples on the set potential is not reduced.

SUMMARY OF THE INVENTION

According to one aspect of the present invention, there is provided a power supply circuit for outputting different set potentials in response to control signals, comprising:

an output terminal that outputs the set potentials;

a boosting circuit that boosts, in response to an input of a boosting clock signal, a voltage supplied from a power supply and outputs the voltage to the output terminal;

a control circuit that outputs the control signals;

a voltage detecting circuit that detects an output potential outputted from the output terminal, compares a first reference potential and the output potential to output a first flag signal including information about a comparison result, and compares a second reference potential higher than the first reference potential and the output potential to output a second flag signal for instructing activation or deactivation of the boosting circuit;

a clock generating circuit that outputs a reference clock signal in response to an input of the first flag signal when the output potential is lower than the first reference potential, and outputs a frequency divided clock signal obtained by dividing the reference clock signal when the output potential is higher than the first reference potential; and a logic circuit that performs an operation based on the second flag signal and one of the reference clock signal and the frequency divided clock signal that are outputted from the clock generating circuit, and outputs the boosting clock signal for activating the boosting circuit;

wherein the voltage detecting circuit changes levels of the first reference potential and the second reference potential in response to inputs of the control signals, and the clock generating circuit increases a frequency of the frequency divided clock signal when the levels of the first reference potential and the second reference potential are greatly changed in response to the inputs of the control signals.

According to the another aspect of the present invention, there is provided a power supply circuit for outputting different set potentials in response to control signals, comprising:

an output terminal that outputs the set potentials;

a boosting circuit that boosts, in response to an input of a boosting clock signal, a voltage supplied from a power supply and outputs the voltage to the output terminal;

a control circuit that outputs the control signal;

a voltage detecting circuit that detects an output potential outputted from the output terminal, compares a first reference potential and the output potential to output a first flag signal including information about a comparison result, and compares a second reference potential level higher than the first reference potential and the output potential to output a second flag signal for instructing activation or deactivation of the boosting circuit;

a frequency switching circuit including a frequency dividing circuit that divides a reference clock signal and outputs a plurality of frequency divided clock signals having different frequencies, a first multiplexer that switches the frequency divided clock signals outputted with different frequencies from the frequency dividing circuit and outputs the frequency divided clock signals in response to inputs of the control signals, and a second multiplexer that outputs a reference clock signal in response to an input of the first flag signal when the output potential is lower than the first reference potential, and switches, when the output potential is higher than the first reference potential, an output to the frequency divided clock signal outputted from the first multiplexer; and a logic circuit that performs an operation based on the second flag signal and one of the reference clock signal and the frequency divided clock signal that are outputted from the clock generating circuit, and outputs the boosting clock signal for activating the boosting circuit;

wherein the voltage detecting circuit changes levels of the first reference potential and the second reference potential in response to the inputs of the control signals, and the first multiplexer of the frequency switching circuit switches an output to the frequency divided clock signal having a higher frequency when the levels of the first reference potential and the second reference potential are greatly changed in response to the inputs of the control signals.

According still further aspect of the present invention, there is provided a semiconductor memory for generating different set potentials from a power supply in response to control signals, comprising:

a power supply circuit that outputs the set potentials in response to the control signals, has:

an output terminal that outputs the set potentials;

a boosting circuit that boosts, in response to an input of a boosting clock signal, a voltage supplied from a power supply and outputs the voltage to the output terminal;

a control circuit that outputs the control signals;

a voltage detecting circuit that detects an output potential outputted from the output terminal, compares a first reference potential and the output potential to output a first flag signal including information about a comparison result, and compares a second reference potential higher than the first reference potential and the output potential to output a second flag signal for instructing activation or deactivation of the boosting circuit;

a clock generating circuit that outputs a reference clock signal in response to an input of the first flag signal when the output potential is lower than the first reference potential, and outputs a frequency divided clock signal obtained by dividing the reference clock signal when the output potential is higher than the first reference potential; and a logic circuit that performs an operation based on the second flag signal and one of the reference clock signal and the frequency divided clock signal that are outputted from the clock generating circuit, and outputs the boosting clock signal for activating the boosting circuit;

wherein the voltage detecting circuit changes levels of the first reference potential and the second reference potential in response to inputs of the control signals, and the clock generating circuit increases a frequency of the frequency divided clock signal when the levels of the first reference potential and the second reference potential are greatly changed in response to the inputs of the control signals.

DETAILED DESCRIPTION

Exemplary embodiments of the present invention will now be described in accordance with the accompanying drawings.

First Embodiment

Figure 1:
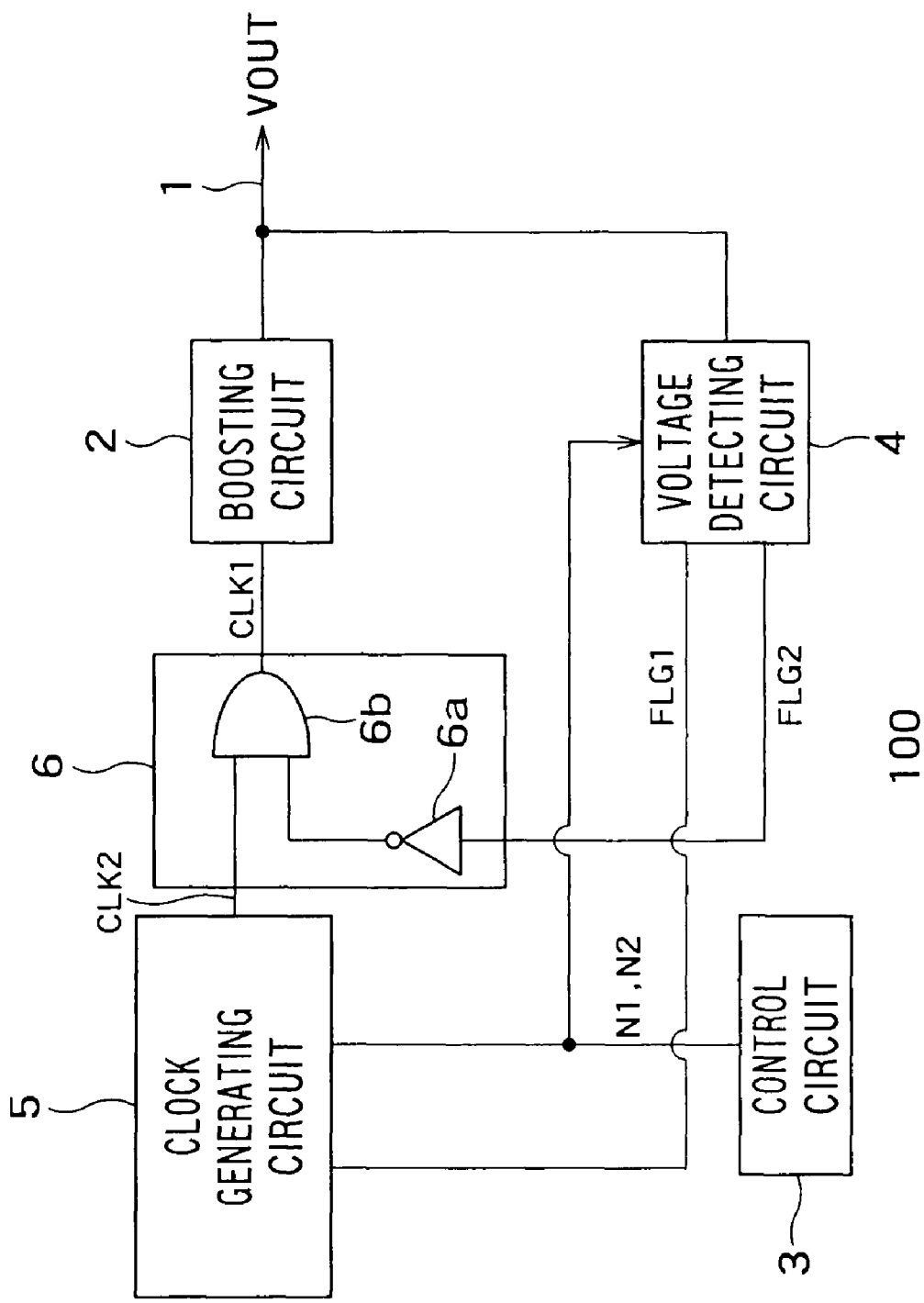
FIG. 1 shows the main configuration of a power supply circuit 100 according to a first embodiment which is an aspect of the present invention.
Figure 2:
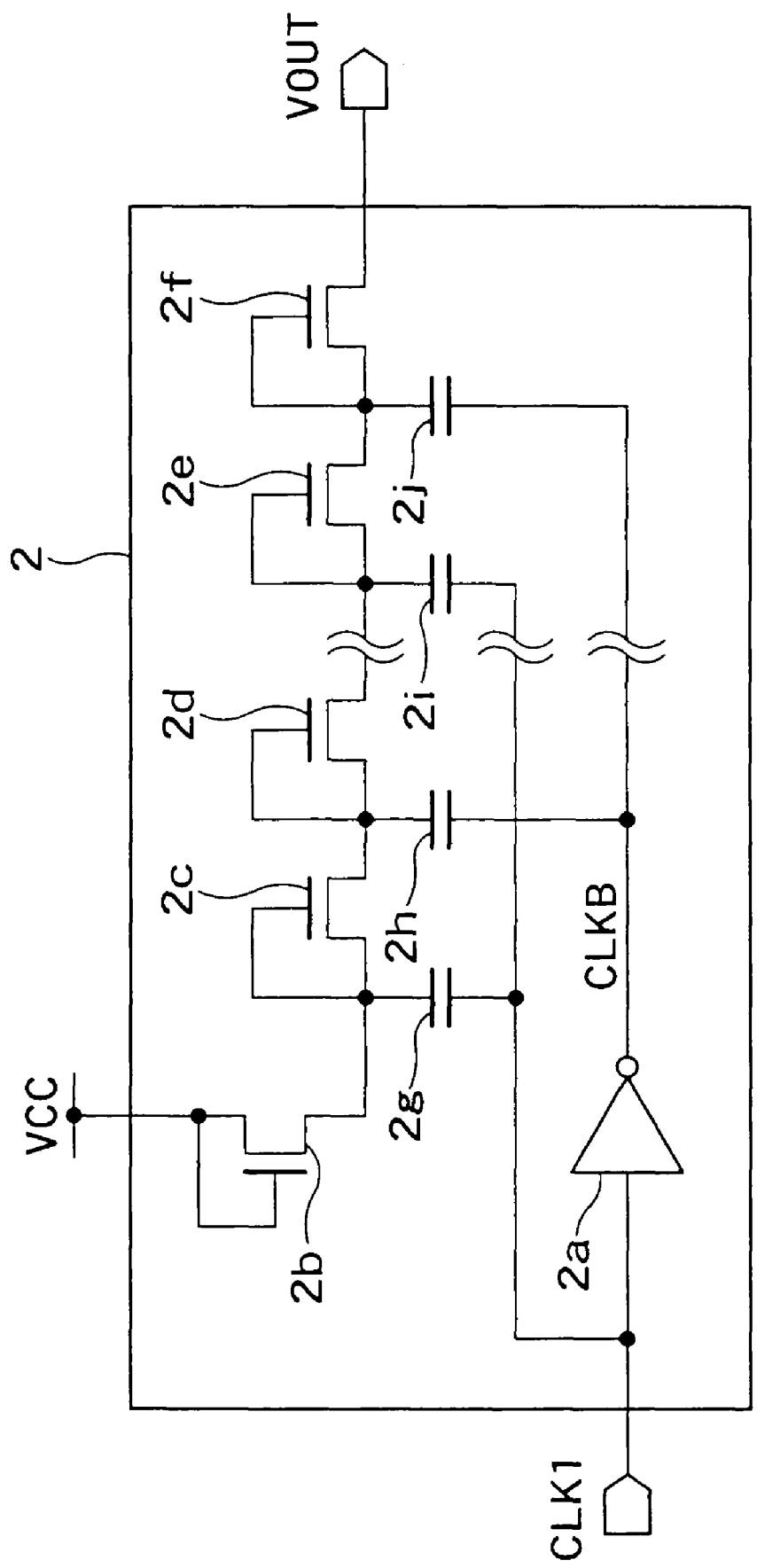
FIG. 2 shows an example of a boosting circuit applied to the power supply circuit of FIG. 1.
Figure 3:
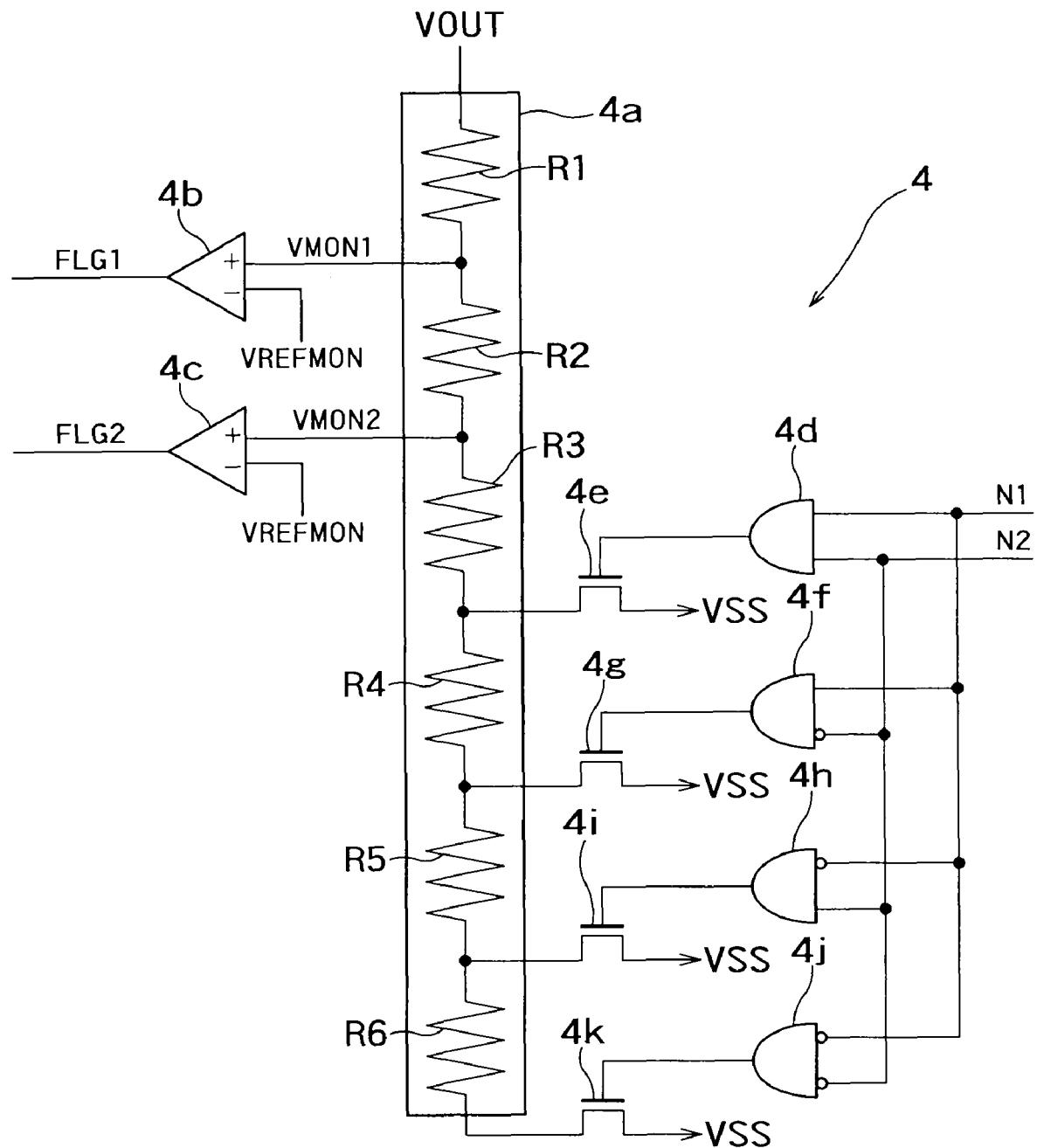
FIG. 3 shows an example of a voltage detecting circuit applied to the power supply circuit of FIG. 1.

FIG. 1 shows the main configuration of a power supply circuit 100 according to a first embodiment which is an aspect of the present invention. FIG. 2 shows an example of a boosting circuit applied to the power supply circuit of FIG. 1. FIG. 3 shows an example of a voltage detecting circuit applied to the power supply circuit of FIG. 1.

As shown in FIG. 1, the power supply circuit 100 for outputting different set potentials in response to control signals N1 and N2 includes an output terminal 1 for outputting the set potentials, a boosting circuit 2 for boosting, in response to an input of a boosting clock signal CLK1, a voltage supplied from a power supply VCC and outputting the boosted voltage to the output terminal 1, and a control circuit 3 for outputting the control signals N1 and N2.

A load connected to the output terminal 1 includes non-volatile memories such as a NAND EEPROM, a NOR EEPROM, a DINOR EEPROM, and an AND EEPROM and circuits and the like requiring a potential boosted higher than the power supply VCC.

As shown in FIG. 2, the boosting circuit 2 includes, for example, an inverter circuit 2a which is fed with the boosting clock signal CLK1 and outputs an inverted clock signal CLKB, a MOS transistor 2b which has a source connected to the power supply potential VCC and has a gate connected to the source of the MOS transistor 2b, MOS transistors 2c to 2f which are connected in series between the drain of the MOS transistor 2b and the output terminal 1 and each of which has a source and a gate connected to each other, and capacitors 2g to 2j connected to the sources of the MOS transistors 2c to 2f, respectively.

In this configuration, the boosting clock signal CLK1 is inputted to the capacitors 2g and 2i and the output of the inverter circuit 2a is connected to the capacitors 2h and 2j. With this configuration, for example, when the boosting clock signal CLK1 is inputted to the boosting circuit 2, the MOS transistors 2c to 2f are alternately operated and the capacitors 2g to 2j are sequentially charged and boosted. And then, the boosted potential is outputted as an output potential VOUT.

As described above, the boosting performance of the boosting circuit 2 can be improved by increasing the capacities of the capacitors 2g to 2j. The configuration of the boosting circuit 2 in FIG. 2 is just an example. Any configuration may be used for the boosting circuit 2 applied to the present embodiment as long as the power supply potential VCC is boosted and outputted in response to the input of the boosting clock signal CLK1.

Furthermore, as shown in FIG. 1, the power supply circuit 100 includes a voltage detecting circuit 4, a clock generating circuit 5, and a logic circuit 6.

The voltage detecting circuit 4 detects the output potential VOUT outputted from the output terminal 1. After that, the voltage detecting circuit 4 compares a first reference potential VREF1 and the output potential VOUT and outputs a first flag signal FLG1 including information about the comparison result. Moreover, the voltage detecting circuit 4 compares a second reference potential VREF2 higher than the first reference potential VREF1 with the output potential VOUT and outputs a second flag signal FLG2 for instructing activation or deactivation of the boosting circuit.

As shown in FIG. 3, the voltage detecting circuit 4 includes a voltage dividing circuit 4a, a first comparator amplifier circuit 4b, and a second comparator and amplifier circuit 4c.

The voltage dividing circuit 4a includes a resistor R1 having one end connected to the output terminal 1, a resistor R2 having one end connected to the other end of the resistor R1, a resistor R3 having one end connected to the other end of the resistor R2, a resistor R4 having one end connected to the other end of the resistor R3, a resistor R5 having one end connected to the other end of the resistor R4, and a resistor R6 having one end connected to the other end of the resistor R5.

The voltage dividing circuit 4a divides the output potential VOUT outputted from the output terminal 1, through the resistors R1 to R6 by resistive division, and the voltage dividing circuit 4a outputs, from the junction point of the resistor R1 and the resistor R2, a first monitored potential VMON1 that is obtained by dividing the output potential VOUT. Furthermore, from the junction point of the resistor R2 and the resistor R3, the voltage dividing circuit 4a outputs a second monitored potential VMON2 that is obtained by dividing the output potential VOUT with a smaller voltage dividing ratio than that of the first monitored potential VMON1.

The first comparator amplifier circuit 4b compares the first monitored potential VMON1 and a reference monitored potential VREFMON to indirectly compare the output potential VOUT and the first reference potential VREF1, and outputs the first flag signal FLG1 according to the comparison result.

The second comparator amplifier circuit 4c compares the second monitored potential VMON2 and the reference monitored potential VREFMON to indirectly compare the output potential VOUT and the second reference potential VREF2, and outputs the second flag signal FLG2 according to the comparison result.

Furthermore, as shown in FIG. 3, the voltage detecting circuit 4 includes a first AND circuit 4d fed with the control signal N1 and the control signal N2 and a first switching circuit 4e that is a MOS transistor connected between the other end of the resistor R3 and a ground potential VSS and has a gate fed with the output signal of the first AND circuit 4d.

Moreover, the voltage detecting circuit 4 includes a second AND circuit 4f fed with the control signal N1 and the inverted control signal N2 and a second switching circuit 4g that is a MOS transistor connected between the other end of the resistor R4 and the ground potential VSS and has a gate fed with the output signal of the second AND circuit 4f.

Furthermore, the voltage detecting circuit 4 includes a third AND circuit 4h fed with the inverted control signal N1 and the control signal N2 and a third switching circuit 4i that is a MOS transistor connected between the other end of the resistor R5 and the ground potential VSS and has a gate fed with the output signal of the third AND circuit 4h.

Moreover, the voltage detecting circuit 4 includes a fourth AND circuit 4j fed with the control signal N1 and the inverted control signal N2 and a fourth switching circuit 4k that is a MOS transistor connected between the other end of the resistor R6 and the ground potential VSS and has a gate fed with the output signal of the fourth AND circuit 4j.

In this configuration, the first to fourth switching circuits 4e, 4g, 4i and 4k are, for example, n-type MOS transistors. However, any switching circuit is applicable as long as the switching circuit is a device or a circuit that can turn on/off the supply of potential and the switching circuit is controlled to be turned on/off by the output signals of the first to fourth AND circuits 4d, 4f, 4h and 4j.

As shown in FIG. 3, when the control signal N1 and the control signal N2 are at, for example, "High" level, that is, logic "1", only the output of the first AND circuit 4d is at "High" level and only the first switching circuit 4e is turned on. The resistive division of the voltage dividing circuit 4a is made up of the resistors R1 to R3 connected in series, and the voltage dividing ratios of the first and second monitored potentials VMON1 and VMON2 are determined relative to the output potential VOUT. The first and second monitored potentials VMON1 and VMON2 are outputted from the voltage dividing circuit 4a with these voltage dividing ratios.

When the control signal N1 is at, for example, "High" level, that is, logic "1" and the control signal N2 is at, for example, "Low" level, that is, logic "0", only the output of the second AND circuit 4f is at "High" level and only the second switching circuit 4g is turned on. The resistive division of the voltage dividing circuit 4a is made up of the resistors R1 to R4 connected in series, and the voltage dividing ratios of the first and second monitored potentials VMON1 and VMON2 are determined relative to the output potential VOUT. The first and second monitored potentials VMON1 and VMON2 are outputted from the voltage dividing circuit 4a with these increased voltage dividing ratios.

When the control signal N1 is at, for example, "Low" level, that is, logic "0" and the control signal N2 is at, for example, "High" level, that is, logic "1", only the output of the third AND circuit 4h is at "High" level and only the third switching circuit 4i is turned on. The resistive division of the voltage dividing circuit 4a is made up of the resistors R1 to R5 connected in series, and the voltage dividing ratios of the first and second monitored potentials VMON1 and VMON2 are determined relative to the output potential VOUT. The first and second monitored potentials VMON1 and VMON2 are outputted from the voltage dividing circuit 4a with these increased voltage dividing ratios.

When the control signal N1 and the control signal N2 are at, for example, "Low" level, that is, logic "0", only the output of the fourth AND circuit 4j is at "High" level and only the fourth switching circuit 4k is turned on. The resistive division of the voltage dividing circuit 4a is made up of the resistors R1 to R6 connected in series, and the voltage dividing ratios of the first and second monitored potentials VMON1 and VMON2 are determined relative to the output potential VOUT. The first and second monitored potentials VMON1 and VMON2 are outputted from the voltage dividing circuit 4a with these further increased voltage dividing ratios.

In this way, the voltage dividing circuit 4a of the voltage detecting circuit 4 changes the voltage dividing ratios of the first monitored potential VMON1 and the second monitored potential VMON2 relative to the output potential VOUT in response to the inputs of the control signals N1 and N2. As a result, the voltage detecting circuit 4 can change the levels of the first reference potential VREF1 and the second reference potential VREF2 in response to the inputs of the control signals N1 and N2.

The clock generating circuit 5 outputs a clock signal CLK2 with a reference clock when the first flag signal FLG1 is at, for example, "Low" level, that is, logic "0" (when the output potential VOUT is lower than the first reference potential VREF1).

Furthermore, when the first flag signal FLG1 is at, for example, "High" level, that is, logic "1" (when the output potential VOUT is higher than the first reference potential VREF1), the clock generating circuit 5 outputs the clock signal CLK2 with a divided clock obtained by dividing the reference clock.

As described above, when the output potential VOUT is lower than the first reference potential VREF1, the clock generating circuit 5 outputs the reference clock signal in response to the input of the first flag signal FLG1. When the output potential VOUT is higher than the first reference potential VREF1, the clock generating circuit 5 outputs the frequency divided clock signal obtained by dividing the reference clock signal. The division by the clock generating circuit 5 includes the division of the reference clock by an integer and the division of the reference clock by a fraction. Therefore, the clock generating circuit 5 can minutely set the frequency of the frequency divided clock signal.

When the voltage detecting circuit 4 greatly changes the levels of the first reference potential VREF1 and the second reference potential VREF2 thus in response to the inputs of the control signals N1 and N2, the clock generating circuit 5 increases the frequency of the frequency divided clock signal.

The logic circuit 6 includes an inverter 6a which is fed with the second flag signal FLG2 and outputs the inverted second flag signal FLG2 and an AND circuit 6b which is fed with the output signal of the inverter 6a and the clock signal (the reference clock signal or the frequency divided clock signal) CLK2 outputted from the clock generating circuit 5, calculates these signals, and outputs the boosting clock signal CLK1.

For example, when the second flag signal FLG2 instructs activation, in the case of, for example, "Low" signal level, that is, logic "0", the output signal of the inverter 6a is set at "High", that is, logic "1". The AND circuit 6b outputs the boosting clock signal CLK1 having the same period as the clock signal CLK2.

When the second flag signal FLG2 instructs deactivation, in the case of, for example, "High" signal level, that is, logic "1", the output signal of the inverter 6a is set at "Low", that is, logic "0". The AND circuit 6b stops outputting the boosting clock signal CLK1.

In this way, the logic circuit 6 performs operations based on the second flag signal FLG2 and one of the reference clock signal and the frequency divided clock signal that are outputted from the clock generating circuit 5, and outputs the boosting clock signal for activating the boosting circuit 2.

The following is an example of the boosting operation of the power supply circuit 100 configured thus.

Figure 4:
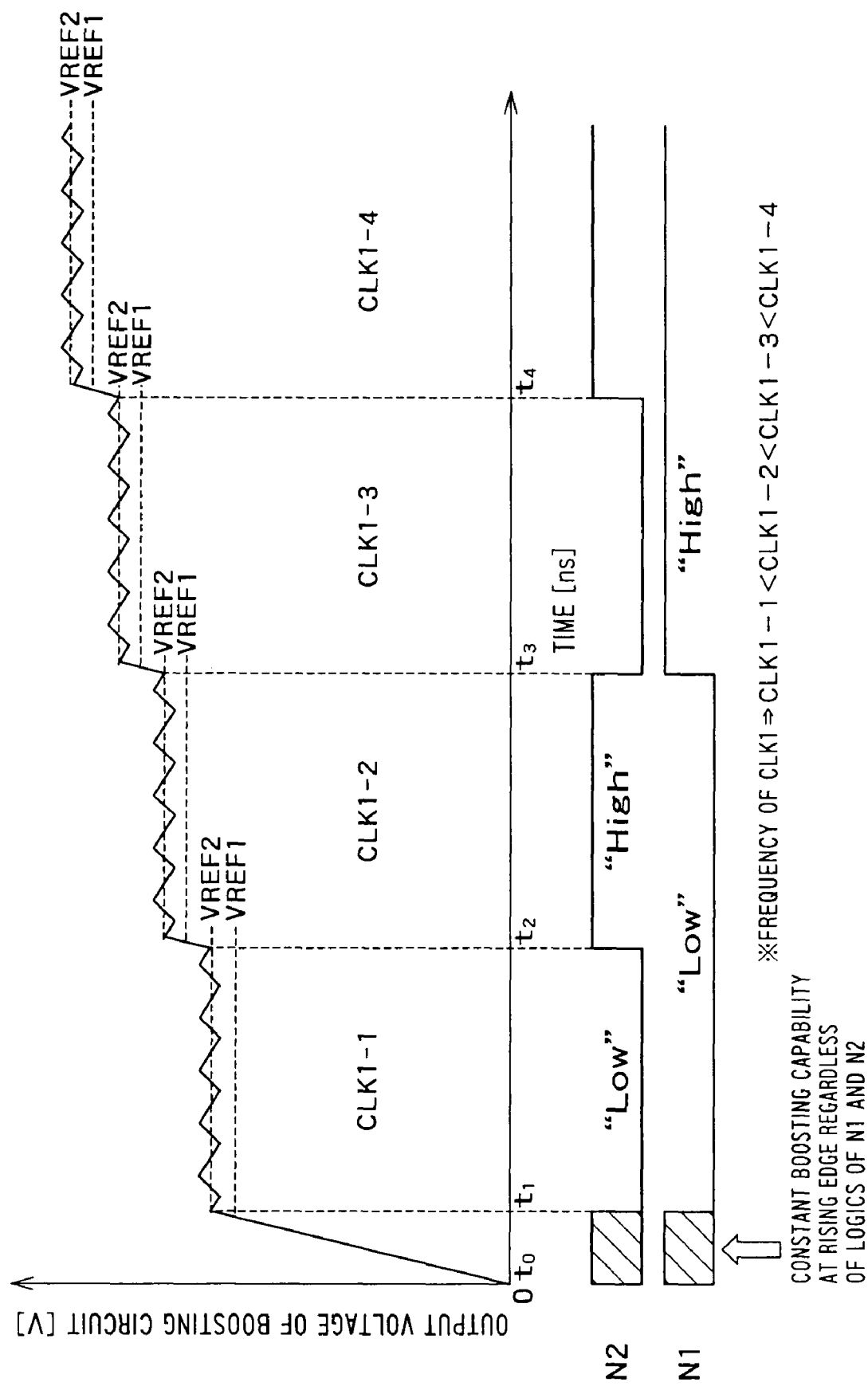
FIG. 4 illustrates the relationship between the timing waveform (time) of the control signal for controlling the boosting operation of the power supply circuit and the output voltage of the power supply circuit (the output voltage of the boosting circuit) according to the first embodiment of the present invention.

FIG. 4 illustrates the relationship between the timing waveform (time) of the control signal for controlling the boosting operation of the power supply circuit and the output voltage of the power supply circuit (the output voltage of the boosting circuit) according to the first embodiment of the present invention.

As shown in FIG. 4, first, the voltage detecting circuit 4 outputs the first flag signal FLG1 at "Low" level from time t0 to time t1. The clock generating circuit 5 outputs the clock signal CLK2 with the reference clock in response to the first flag signal FLG1. Thus the boosting circuit 2 is activated by the boosting clock signal CLK1 with the reference clock and performs the boosting operation. In this way, at the start of the boosting operation, the boosting circuit 2 has constant boosting capability from the output potential VOUT of 0 V to the initial first reference potential VREF1 regardless of the logics of the control signals N1 and N2.

Subsequently, at time t1, the voltage detecting circuit 4 outputs the first flag signal FLG1 at "High" level. The clock generating circuit 5 outputs the clock signal CLK2 with the divided clock in response to the first flag signal FLG1. Thus the boosting circuit 2 is activated by the boosting clock signal CLK1 with the divided clock and performs the boosting operation.

In this way, when the output potential VOUT exceeds the first reference potential VREF1, the boosting clock signal CLK1 is switched to the clock signal with the divided clock depending upon the set potential, so that the boosting capability of the boosting circuit 2 decreases.

Thus when the set potential is increased, the boosting capability of the boosting circuit 2 is increased with the set potential by changing the logics of the control signals N1 and N2 as follows:

As shown in FIG. 4, for example, in the case of the signal level of the control signal N1=the signal level of the control signal N2="Low" at time t1, the clock generating circuit 5 outputs the clock signal CLK2 with a divided clock obtained by dividing the reference clock by, e.g., 16. The boosting circuit 2 is activated by a boosting clock signal CLK1-1 corresponding to the clock signal CLK2 and performs the boosting operation.

Subsequently, when the set potential increases at time t2, for example, the signal level of the control signal N1 is set at "Low" and the signal level of the control signal N2 is set at "High", so that the clock generating circuit 5 outputs the clock signal CLK2 with a divided clock obtained by dividing the reference clock by, e.g., eight. The boosting circuit 2 is activated by a boosting clock signal CLK1-2 corresponding to the clock signal CLK2 and performs the boosting operation.

And then, when the set potential further increases at time t3, for example, the signal level of the control signal N1 is set at "High" and the signal level of the control signal N2 is set at "Low", so that the clock generating circuit 5 outputs the clock signal CLK2 with a divided clock obtained by dividing the reference clock by, e.g., four. The boosting circuit 2 is activated by a boosting clock signal CLK1-3 corresponding to the clock signal CLK2 and performs the boosting operation.

Subsequently, when the set potential further increases at time t4, for example, the signal levels of the control signals N1 and N2 are set at "High", so that the clock generating circuit 5 outputs the clock signal CLK2 with a divided clock obtained by dividing the reference clock by, e.g., two. The boosting circuit 2 is activated by a boosting clock signal CLK1-4 corresponding to the clock signal CLK2 and performs the boosting operation.

Thus by the division in the clock generating circuit 5, the frequency of the boosting clock signal CLK has the relationship of the boosting clock signal CLK1-1<the boosting clock signal CLK1-2<the boosting clock signal CLK1-3<the boosting clock signal CLK1-4. Therefore, the boosting capability of the boosting circuit 2 can be increased with the set potential.

In the voltage detecting circuit 4, the switching circuits 4e, 4g, 4i and 4k are controlled to be turned on or off as described above according to the logics of the control signals N1 and N2 and the levels of the first reference potential VREF1 and the second reference potential VREF2 are greatly changed, so that the set potential is greatly changed.

With this operation, when the power supply circuit 100 is applied to, for example, a NAND flash memory, the writing operation on cells can be shifted from a low potential to a high potential.

As described above, the power supply circuit 100 changes the boosting clock signal CLK1 of the boosting circuit 2 according to the set potential, and the boosting capability of the boosting circuit 2 improves with the set potential. Since the power supply circuit 100 operates thus, it is possible to reduce the dependence of the boosting capability of the power supply circuit 100 on the set potential and the dependence of ripples of the output potential on the set potential.

In the power supply circuit 100, the clock generating circuit 5 is prepared only for the boosting circuit 2. Thus the frequency parameter of the reference clock can be changed regardless of other boosting circuits.

The following is an example in which the power supply circuit 100 operating thus is applied to a NAND flash memory which is a semiconductor memory.

Figure 5:
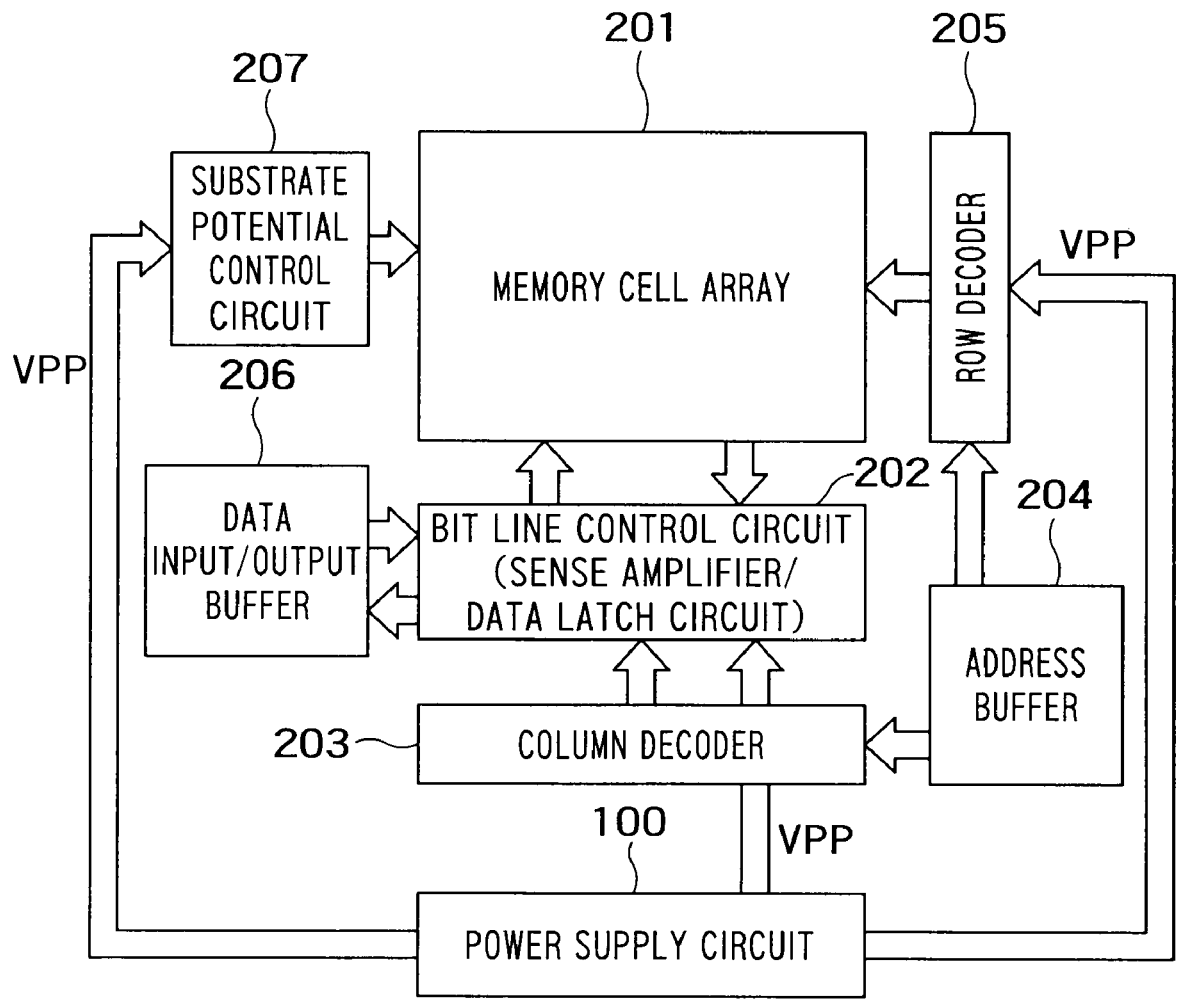
FIG. 5 is a block diagram showing an example of the NAND flash memory including the power supply circuit 100 according to the first embodiment which is an aspect of the present invention.

FIG. 5 is a block diagram showing an example of the NAND flash memory including the power supply circuit 100 according to the first embodiment which is an aspect of the present invention.

As shown in FIG. 5, a semiconductor memory 200, which is a NAND flash memory, includes a bit line control circuit 202 for writing and reading data on a memory cell array 201 serving as memory means.

The bit line control circuit 202 is connected to a data input/output buffer 206. Furthermore, the bit line control circuit 202 receives, as an input, the output of a column decoder 203 receiving an address signal from an address buffer 204.

The semiconductor memory 200 further includes a row decoder 205 for controlling a control gate and a selecting gate on the memory cell array 201, and a substrate potential control circuit 207 for controlling the potential of a p-type substrate (or a p-type well) on which the memory cell array 201 is formed.

Moreover, the semiconductor memory 200 includes the power supply circuit 100 of the present embodiment.

The power supply circuit 100 supplies an output potential VPP (VOUT) to the bit line control circuit 202, the row decoder 205, and the substrate potential control circuit 207 during reading/writing/deletion on the memory cell array 201. In other words, in the semiconductor memory 200, the power supply circuit 100 generates different set potentials from a power supply VCC in response to the control signals N1 and N2.

As described above, the power supply circuit 100 can supply the output potential VOUT with reduced ripples to this circuit configuration.

In this way, the power supply circuit of the present embodiment can reduce the dependence of the boosting capability on the set potential according to the plurality of set potentials, and can reduce ripples.

Therefore, for example, during a writing operation on cells of the NAND flash memory, it is possible to reduce ripples on the word lines of a selected cell and an unselected cell, reduce a Vth distribution of writing cells, and reduce erroneous writing and the like on the unselected cell.

Second Embodiment

The first embodiment described the configuration in which the reference clock is generated by the clock generating circuit.

In the present embodiment, a configuration using an existing reference clock will be described.

Figure 6:
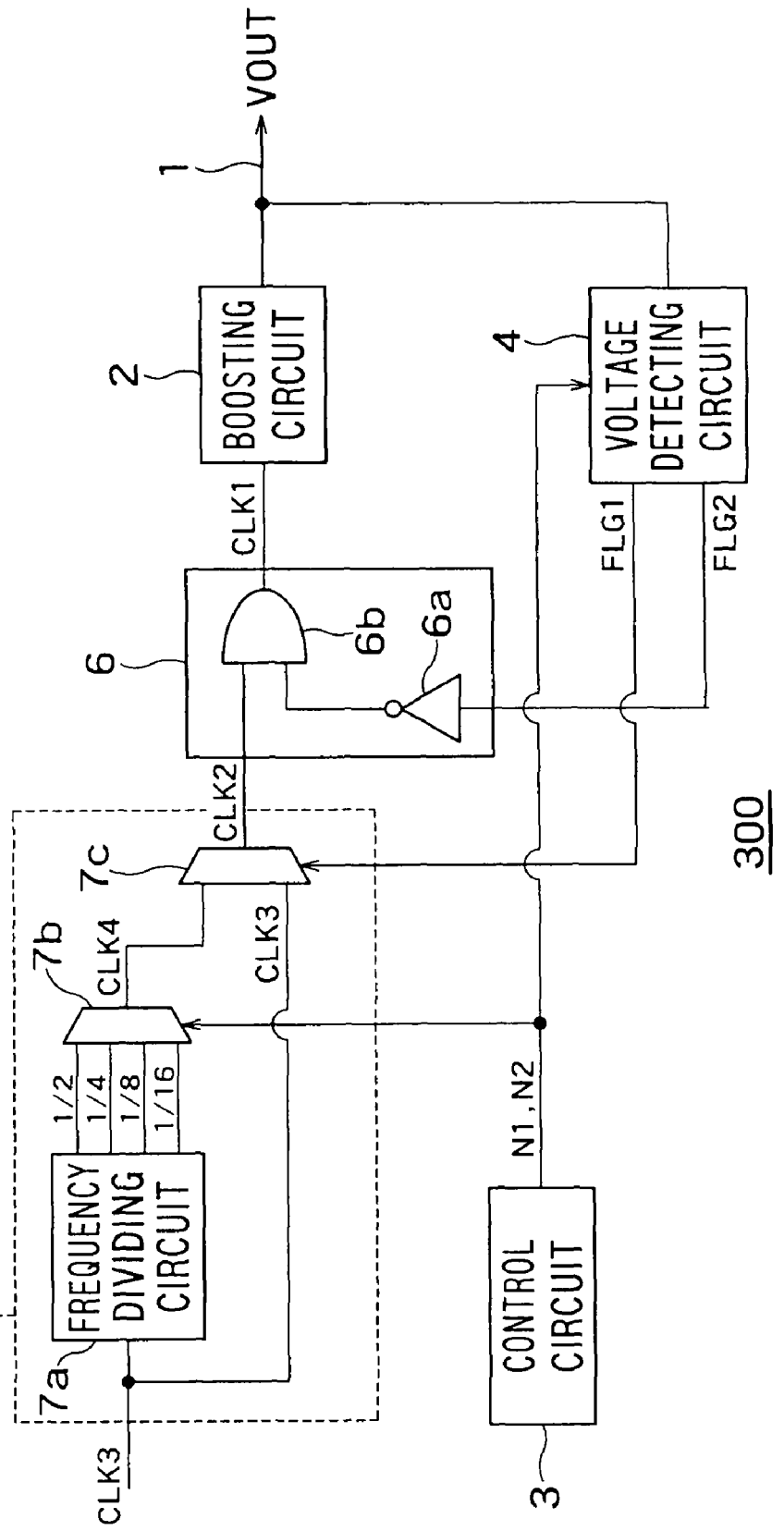
FIG. 6 shows the main configuration of a power supply circuit 300 according to a second embodiment which is an aspect of the present invention.

FIG. 6 shows the main configuration of a power supply circuit 300 according to a second embodiment which is an aspect of the present invention. The same reference numerals as those of FIG. 1 indicate the same configurations as the first embodiment.

As shown in FIG. 6, the power supply circuit 300 includes a frequency switching circuit 7 instead of the clock generating circuit. Other configurations are the same as those of the first embodiment.

The frequency switching circuit 7 includes a frequency dividing circuit 7a, a first multiplexer 7b, and a second multiplexer 7c.

The frequency dividing circuit 7a divides a reference clock signal CLK3 (e.g., ½, ¼, ⅛ and 1/16) and outputs a plurality of frequency divided clock signals CLK4 having different frequencies.

The first multiplexer 7b switches, in response to the inputs of control signals N1 and N2, the frequency divided clock signals CLK4 which have different frequencies and are outputted from the frequency dividing circuit 7a, and the first multiplexer 7b outputs the frequency divided clock signals CLK4.

When an output potential VOUT is lower than a first reference potential VREF1, the second multiplexer 7c outputs a reference clock signal in response to the input of a first flag signal FLG1. When the output potential VOUT is higher than the first reference potential VREF1, the second multiplexer 7c switches the output to the frequency divided clock signal CLK4 outputted from the first multiplexer 7b.

In this case, the relationship between the timing waveform (time) of the control signal for controlling the boosting operation of the power supply circuit 300 and the output voltage of the power supply circuit (the output voltage of the boosting circuit) according to the second embodiment is basically similar to that of the first embodiment shown in FIG. 4.

As shown in FIGS. 4 and 6, at the lowest set potential, that is, in the case of the control signal N1 at "Low" level and the control signal N2 at "Low" level, the first multiplexer 7b switches the output to the frequency divided clock signal CLK4 obtained by dividing the reference clock into 16. At this moment, the first flag signal FLG1 is at "High" level (when the output potential VOUT is higher than the first reference potential VREF1) and the second multiplexer 7c switches the output to the frequency divided clock signal CLK4 outputted from the first multiplexer 7b.

At the third highest set potential, that is, in the case of the control signal N1 at "Low" level and the control signal N2 at "High" level, the first multiplexer 7b switches the output to the frequency divided clock signal CLK4 obtained by dividing the reference clock into eight. At this moment, the first flag signal FLG1 is at "High" level (when the output potential VOUT is higher than the first reference potential VREF1) and the second multiplexer 7c switches the output to the frequency divided clock signals CLK4 outputted from the first multiplexer 7b.

At the second highest set potential, that is, in the case of the control signal N1 at "High" level and the control signal N2 at "Low" level, the first multiplexer 7b switches the output to the frequency divided clock signal CLK4 obtained by dividing the reference clock into four. At this moment, the first flag signal FLG1 is at "High" level (when the output potential VOUT is higher than the first reference potential VREF1) and the second multiplexer 7c switches the output to the frequency divided clock signal CLK4 outputted from the first multiplexer 7b.

At the highest set potential, that is, when the control signal N1 and the control signal N2 are at "High" level, the first multiplexer 7b switches the output to the frequency divided clock signal CLK4 obtained by dividing the reference clock into two. At this moment, the first flag signal FLG1 is at "High" level (when the output potential VOUT is higher than the first reference potential VREF1) and the second multiplexer 7c switches the output to the frequency divided clock signal CLK4 outputted from the first multiplexer 7b.

In this way, when the levels of the first reference potential VREF1 and the second reference potential VREF2 are greatly changed in response to the inputs of the control signals N1 and N2, the first multiplexer 7b switches the output to the frequency divided clock signal CLK4 having a higher frequency.

These frequency divided clock signals CLK4 are inputted as a clock signal CLK2 from the second multiplexer 7c to a logic circuit 6, and then the signal is supplied as a boosting clock signal CLK1 to a boosting circuit 2.

In this way, as in the first embodiment, the power supply circuit 300 changes the boosting clock signal CLK1 of the boosting circuit 2 according to the set potential, and the boosting capability of the boosting circuit 2 improves with the set potential. With this operation of the power supply circuit 300, as in the first embodiment, it is possible to reduce the dependence of the boosting capability of the power supply circuit 300 on the set potential and the dependence of ripples of the output potential VOUT on the set potential.

The power supply circuit 300 of the present embodiment is also applicable to the semiconductor memory 200 of FIG. 5 as in the first embodiment. In this case, a reference clock signal is further necessary.

As described above, the power supply circuit of the present embodiment can reduce the dependence of the boosting capability on the set potential according to the plurality of set potentials and can reduce ripples.

Therefore, for example, during a writing operation on cells of a NAND flash memory, it is possible to reduce ripples on the word lines of a selected cell and an unselected cell, reduce a Vth distribution of writing cells, and reduce erroneous writing and the like on the unselected cell.

The logics of the control signals and the first and second flag signals are just an example. Other logics may be used as long as the power supply circuit performs the same operations.

What is claimed is:

1. A power supply circuit for outputting different set potentials in response to control signals, comprising:
    an output terminal that outputs the set potentials;
    a boosting circuit that boosts, in response to an input of a boosting clock signal, a voltage supplied from a power supply and outputs the voltage to the output terminal;
    a control circuit that outputs the control signal;
    a voltage detecting circuit that detects an output potential outputted from the output terminal, compares a first reference potential and the output potential to output a first flag signal including information about a comparison result, and compares a second reference potential level higher than the first reference potential and the output potential to output a second flag signal for instructing activation or deactivation of the boosting circuit;

a frequency switching circuit including a frequency dividing circuit that divides a reference clock signal and outputs a plurality of frequency divided clock signals having different frequencies, a first multiplexer that switches the frequency divided clock signals outputted with different frequencies from the frequency dividing circuit and outputs the frequency divided clock signals in response to inputs of the control signals, and a second multiplexer that outputs a reference clock signal in response to an input of the first flag signal when the output potential is lower than the first reference potential, and switches, when the output potential is higher than the first reference potential, an output to the frequency divided clock signal outputted from the first multiplexer; and a logic circuit that performs an operation based on the second flag signal and one of the reference clock signal and the frequency divided clock signal, and outputs the boosting clock signal for activating the boosting circuit;

wherein the voltage detecting circuit changes levels of the first reference potential and the second reference potential in response to the inputs of the control signals, and the first multiplexer of the frequency switching circuit switches an output to the frequency divided clock signal having a higher frequency when the levels of the first reference potential and the second reference potential are greatly changed in response to the inputs of the control signals.

2. The power supply circuit according to claim 1, wherein the voltage detecting circuit comprises:

a voltage dividing circuit that divides, by resistive division, the output potential outputted from the output terminal, outputs a first monitored potential obtained by dividing the output potential, outputs a second monitored potential obtained by dividing the output potential with a smaller voltage dividing ratio than the voltage dividing ratio of the first monitored potential, and changes the voltage dividing ratios of the first monitored potential and the second monitored potential relative to the output potential in response to the inputs of the control signals;

a first comparator amplifier circuit that indirectly compares the output potential and the first reference potential by comparing the first monitored potential and a reference monitored potential, and outputs the first flag signal according to a comparison result; and a second comparator amplifier circuit that indirectly compares the output potential and the second reference potential by comparing the second monitored potential and the reference monitored potential, and outputs the second flag signal according to a comparison result.

* * * * *